US009455030B1

(12) United States Patent
Wu et al.

(10) Patent No.: US 9,455,030 B1
(45) Date of Patent: Sep. 27, 2016

(54) METHOD AND APPARATUS FOR PERFORMING SIGNAL PROCESSING ON A CROSSBAR ARRAY OF RESISTIVE MEMORY DEVICES

(71) Applicant: THE UNITED STATES OF AMERICA, AS REPRESENTED BY THE SECRETARY OF THE AIR FORCE, Washington, DC (US)

(72) Inventors: Qing Wu, Manlius, NY (US); Richard Linderman, Rome, NY (US); Mark Barnell, North Syracuse, NY (US); Yiran Chen, Pittsburgh, PA (US); Hai Li, Pittsburgh, PA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/977,683

(22) Filed: Dec. 22, 2015

(51) Int. Cl.
*G11C 11/00* (2006.01)
*G11C 13/00* (2006.01)

(52) U.S. Cl.
CPC .................... *G11C 13/0038* (2013.01)

(58) Field of Classification Search
USPC ............... 365/148, 174, 175, 45, 46
See application file for complete search history.

(56) References Cited

U.S. PATENT DOCUMENTS

| | | | |
|---|---|---|---|
| 6,181,159 B1 * | 1/2001 | Rangasayee | H03K 19/17728 326/39 |
| 9,152,827 B2 * | 10/2015 | Linderman | G06G 7/16 |
| 2014/0293678 A1 * | 10/2014 | Orlowski | H01L 45/08 365/148 |
| 2015/0170025 A1 * | 6/2015 | Wu | G06N 3/0635 706/25 |

* cited by examiner

*Primary Examiner* — Vu Le
(74) *Attorney, Agent, or Firm* — Joseph A. Mancini

(57) ABSTRACT

Invention provides an apparatus and method for performing signal processing on a crossbar array of resistive memory devices. The invention is implemented using one or multiple crossbar arrays of resistive memory devices in conjunction with devices for converting input real number representations to voltage waveforms, devices for converting current waveforms into voltage waveforms, and devices for converting voltage waveforms to real numbers outputs.

20 Claims, 4 Drawing Sheets

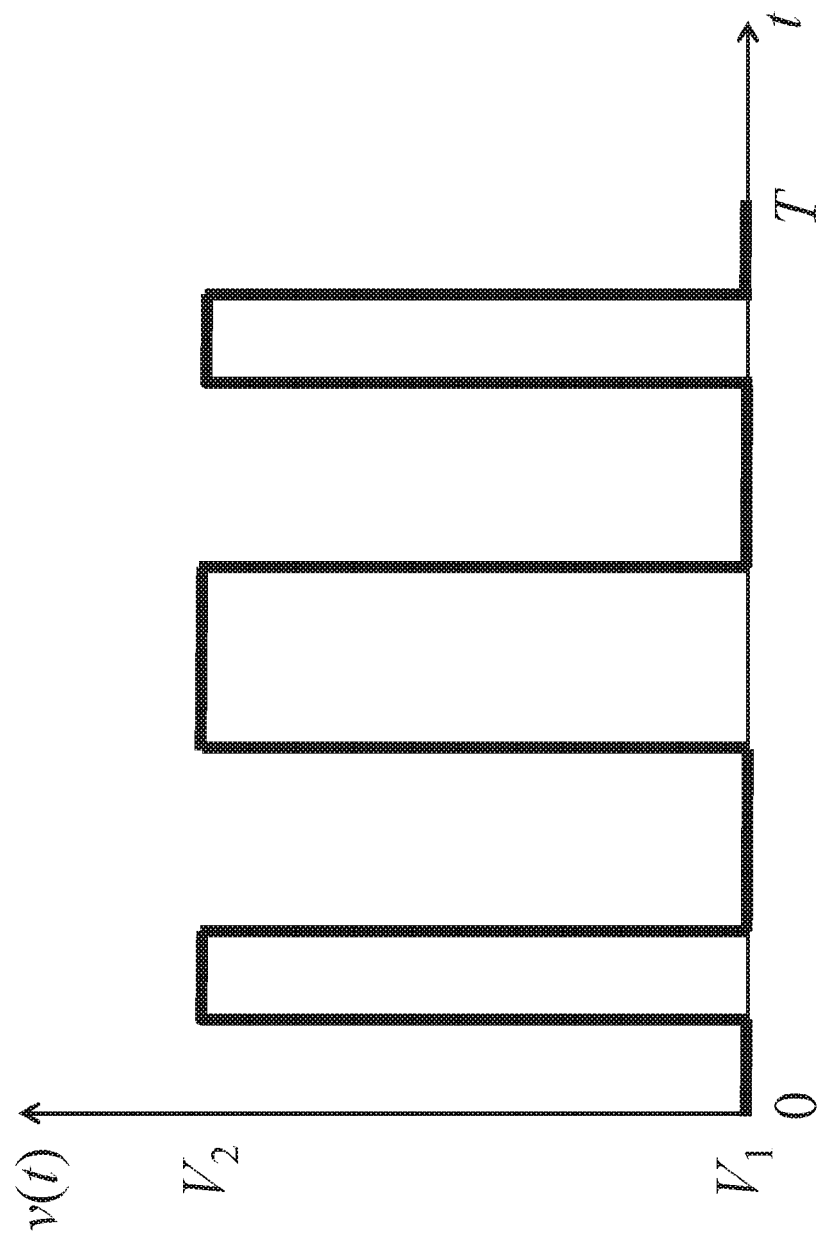

METHOD AND APPARATUS FOR PERFORMING SIGNAL PROCESSING ON A CROSSBAR ARRAY OF RESISTIVE MEMORY DEVICES

STATEMENT OF GOVERNMENT INTEREST

The invention described herein may be manufactured and used by or for the Government for governmental purposes without the payment of any royalty thereon.

BACKGROUND OF THE INVENTION

As demand on high performance computation continuously increases, the traditional Von Neumann computer architecture becomes less efficient. In recent years, neuromorphic hardware systems have gained great attentions. Such systems can potentially provide the capabilities of biological perception and information processing within a compact and energy-efficient platform. Systems such as these can be used in different computing platforms for high performance computing under size, weight and power (SWaP) constraints. Potential Air Force applications, for example, include autonomy and autonomous systems, communication and networking, intelligence data analytics and cyber situational awareness.

To this end, a resistive crossbar array based computing system has the potential to enable high-efficient, large-scale signal processing. Such systems, for example, can dramatically improve the capabilities in pattern recognition used in modern artificial intelligence systems. In such systems, a crossbar array of resistive memory devices is used to carry out signal processing computations.

OBJECTS AND SUMMARY OF THE INVENTION

The present invention relates generally to methods and apparatuses for sensing the current that represents the computation results from a resistive memory device (i.e., "memristor") crossbar array and converting it to a digital word using low-power circuit with small form factor.

It is an object of the present invention to design an apparatus and method that transforms an input digital word into a distinct output digital word as a function of the current and voltage the input digital word generates across an array of resistive memory devices.

In an embodiment of the present invention, an apparatus for a resistive memory array signal processor, comprises a first converter for converting a real number vector input into a temporal sequence of voltage waveform outputs; at least one resistive memory array, having the sequence of voltage waveforms as inputs, for converting the sequence of voltage waveforms into current waveform outputs; an integrator for accumulating the current waveform outputs; a second converter, having the accumulated current waveforms as inputs, for converting the accumulated current waveforms into voltage waveform outputs; and a third converter, having the voltage waveforms as inputs, for converting the voltage waveforms into a real number output.

In another embodiment of the present invention, a method for performing signal processing using a crossbar array of resistive memory devices, comprises the steps of a first mapping of a real number input to a voltage waveform; applying the voltage waveform to a plurality of wordline inputs of the crossbar array of resistive memory devices; accumulating current waveforms through each of a plurality of bitline outputs of the crossbar array of resistive memory devices; integrating the accumulated current waveforms: converting the integrated current waveforms to voltage waveforms; and a second mapping of the voltage waveforms to a real number output.

Briefly stated, the present invention provides an apparatus and method for performing signal processing on a crossbar array of resistive memory devices. The invention is implemented using one or multiple crossbar arrays of resistive memory devices in conjunction with devices for converting input real number representations to voltage waveforms, devices for converting current waveforms into voltage waveforms, and devices for converting voltage waveforms to real numbers outputs.

The above and other objects, features and advantages of the present invention will become apparent from the following description read in conjunction with the accompanying drawings, in which like reference numerals designate the same elements.

BRIEF DESCRIPTION OF THE DRAWINGS

FIG. 4 depicts an exemplary pulse-based voltage waveform to be applied to the wordlines of a basic crossbar array.

SUMMARY OF THE INVENTION

The present invention provides an apparatus and method for performing signal processing on a crossbar array of resistive memory devices, using pulse-based representations of input and output values. The invention is implemented using one or multiple crossbar arrays of resistive memory devices in conjunction with devices for converting real number representations to voltage waveforms, devices for converting current waveforms into voltage waveforms, and devices for converting voltage waveforms to real numbers, all of which may be implemented in electronic hardware or electronic hardware augmented by firmware or computer software.

Relying on a one-to-one mapping between a mathematical value and a pulse-based voltage waveform, each individual input value can be represented by a temporal sequence of voltage pulses applied to a wordline (row) of the crossbar array. The resistive crossbar design converts the input voltage pulse waveforms into output current waveforms at the bitlines (column) of the crossbar array. An integrator block is used to convert the output current waveform to a total accumulated current value. The accumulated current of each output of the crossbar is then converted back into pulse-based voltage waveform, using the reverse of the same (with a different scale factor) one-to-one mapping function for the input conversion.

DESCRIPTION OF THE PREFERRED EMBODIMENT

This describes the apparatus and method for performing signal processing using pulse-based representations of the inputs and outputs, through a crossbar array of resistive memory devices.

Figure 1:
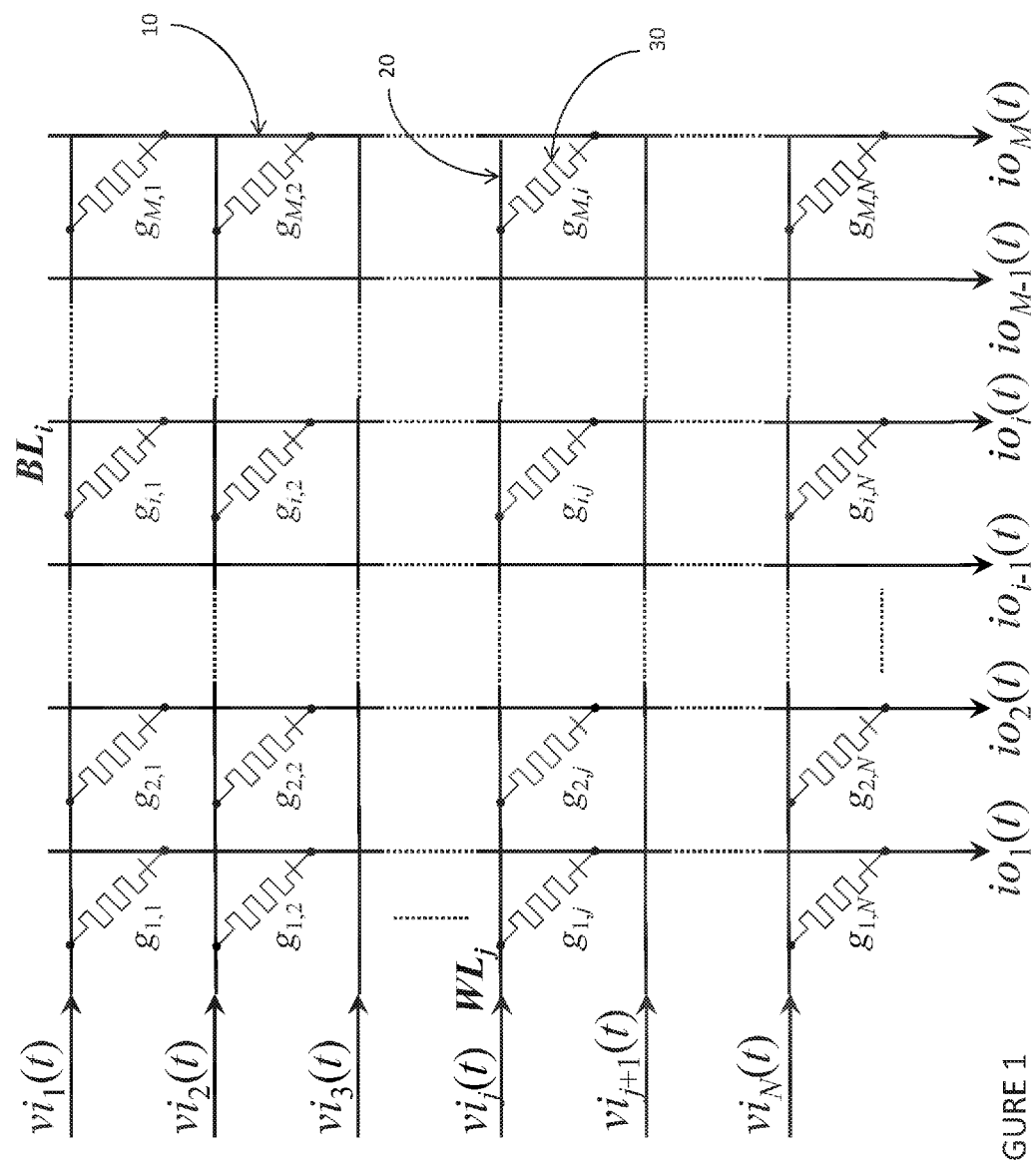
FIG. 1 depicts a basic crossbar array with N rows and M columns of resistive memory devices.

The basic circuit of the invention's crossbar array with N rows and M columns of resistive memory devices 30 is shown in the FIG. 1. For each pair of wordline (WL) 20 and bitline (BL) 10, there is one resistive memory device 30 (memristor) connecting them. This embodiment of the present invention assumes that the conductance of the resistive memory device connecting $WL_j$ and $BL_i$ is set at $g_{i,j}$.

When voltage waveforms $vi_j(t)$ (j=1, 2, . . . , N) are applied to the wordlines 20 (inputs), also assuming that the bitlines 10 are all held at 0 Volt, the current waveforms $io_i(t)$ at the end (bottom) of each of the bitlines 10 can be calculated by:

$$io_i(t) = \Sigma_{j=1}^{N}(vi_j(t) \cdot g_{i,j}), i=1,2, \ldots, M \quad (1)$$

The integration of the current waveforms and the output current waveforms over a period of time T, resulting from all the bitlines, is represented by:

$$\int_0^T io_i(t)dt = \Sigma_{j=1}^{N}(g_{i,j} \cdot \int_0^T vi_j(t)dt), i=1,2, \ldots, M \quad (2)$$

Figure 2C:
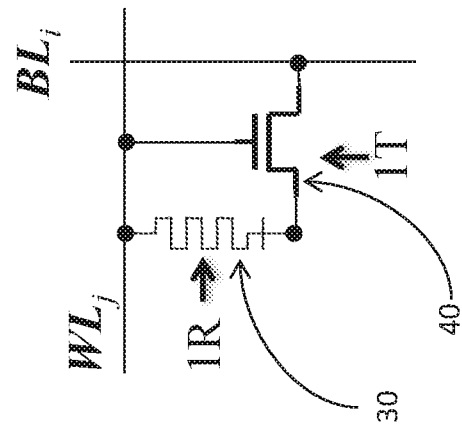
FIG. 2c depicts an alternate 1R resistive memory device and 1T transistor device configuration with wordlines and bitlines, referred as the 1T1R structure.
Figure 2B:
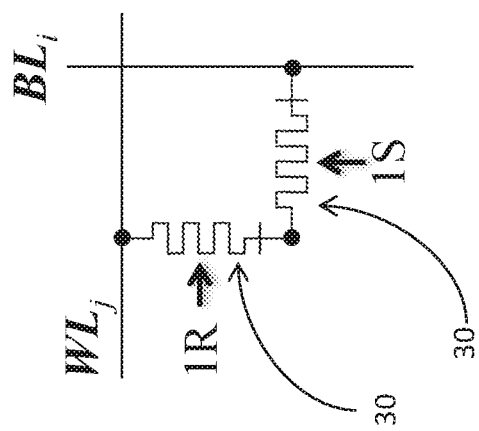
FIG. 2b depicts an alternate 1S1R resistive memory device configuration with wordlines and bitlines.
Figure 2A:
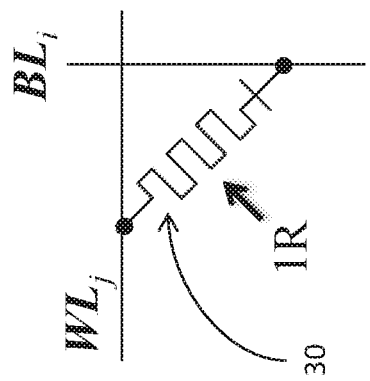
FIG. 2a depicts a standard 1R resistive memory device configuration with wordlines and bitlines.

Referring to FIG. 2 depicts alternative implementations of the crossbar array shown in FIG. 1. Within the scope of the present invention, the resistive memory device 30 "1R" structure (shown in FIG. 2(a)) can be replaced with either the "1S1R" structure of serially connected one resistive memory "1R" device 30 and one "1S" device (shown in FIG. 2(b)), or the "1T1R" structure connected one resistive memory "1R" device 30 and one transistor "1T" device 40 (shown in FIG. 2(c)).

Figure 3:
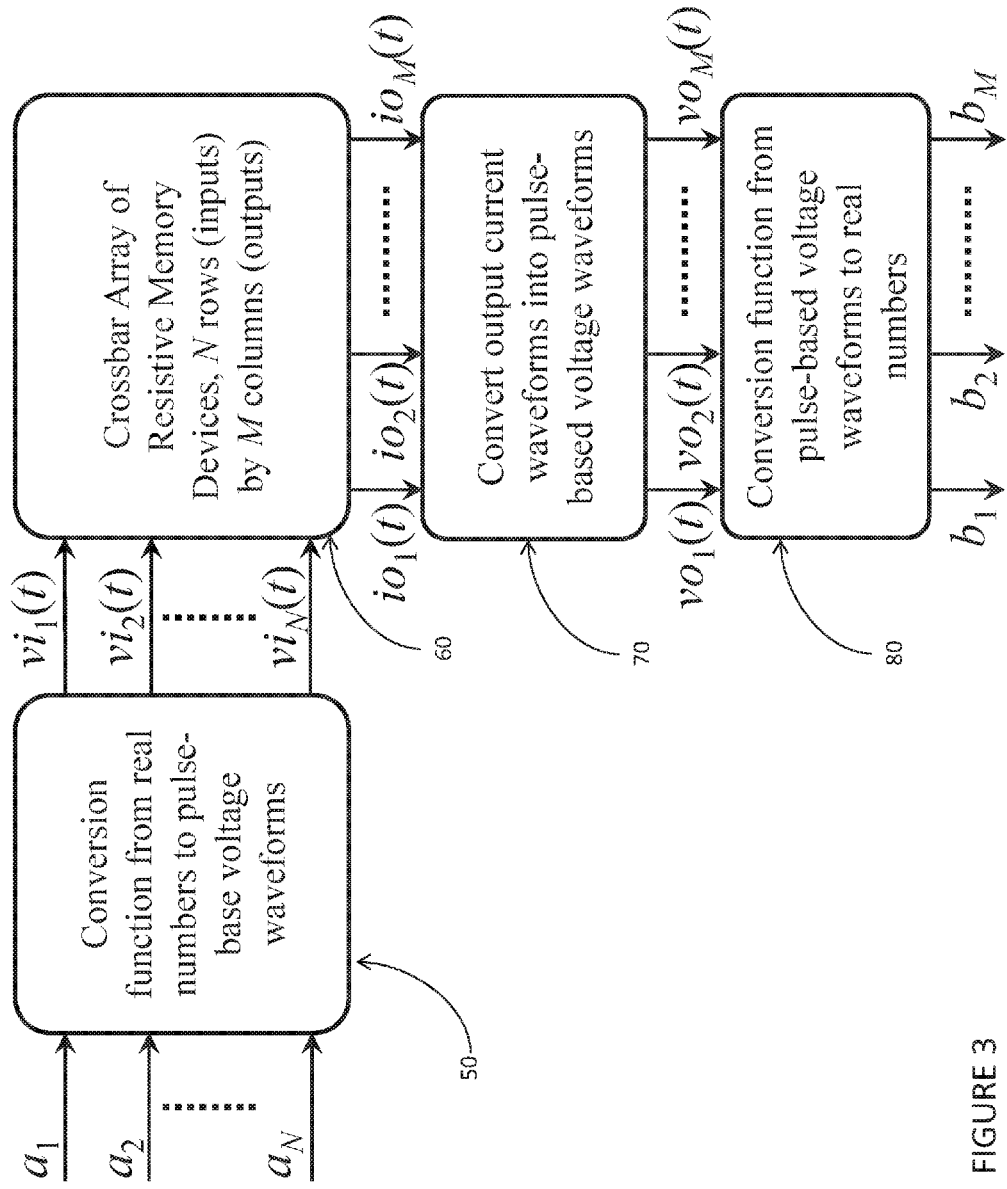
FIG. 3 depicts the functionality of a basic crossbar array.

Referring to FIG. 3, the present invention based on the design of the crossbar array of resistive memory devices is now functionally depicted. The input to the system is a vector $[a_1, a_2, a_N]$ where $a_j$ (j=1, 2, . . . , N) is a real number. A one-to-one conversion (mapping) function 50 converts the input real numbers into pulse-base voltage waveforms in the time period of [0, T]. The conversion (mapping) process can be written as:

$$vi_j(t) \Longleftrightarrow M_A(a_j,t), t \in [0,T], j=1,2, \ldots, N \quad (3)$$

Where $vi_j(t)$ is a pulse-based voltage waveform, which means that $vi_j(t)$ can only be one of the two predefined voltage levels: $V_1$ and $V_2$. An example of the pulse-based voltage waveform in time period [0, T] is shown in FIG. 4. When these voltage waveforms are applied 60 to the wordlines 20 of the crossbar array (see FIG. 1), current waveforms are generated at the end of the bitlines 10 (see FIG. 1), according to Equation (1). A conversion module/function (CF) is then used to convert 70 each current waveform into pulse-based voltage waveform:

$$vo_i(t) = CF(io_i(t)), t \in [0,T], i=1,2, \ldots, M \quad (4)$$

Note that with more than one input voltage waveforms applied, the output current may not follow a pulse-based waveform. Finally the invention applies another one-to-one conversion (mapping) function that converts 80 output pulse-base voltage waveforms (in the time period of [0, T]) into real numbers. The conversion (mapping) process 80 can be written as:

$$b_i \Longleftrightarrow M_B(vo_i(t)), t \in [0,T], i=1,2, \ldots, M \quad (5)$$

Please also note that the first and last conversion/mapping steps can be omitted if the system is already using pulse-based representations.

For the embodiment of the present invention described in the previous section, there can be many choices of the conversion/mapping functions $M_A$, $M_B$ and CF. Specific implementations of the conversion/mapping functions are possible.

If the input voltage waveforms of $vi_j(t)$ are restricted to periodical pulse functions with fixed pulse width of $T_p$, function $M_A$ can be implemented by mapping the real number $a_j$ to a unique frequency value of the pulse waveform such that:

$$a_j = \alpha \int_0^T vi_j(t)dt, j=1,2, \ldots, N \quad (6)$$

where $\alpha$ is a positive constant scalar number.

For converting function CF from $io_i(t)$ to $vo_i(t)$, the accumulated total current by integrating $io_i(t)$ over time period [0, T] can be first calculated according to:

$$I_i^{total} = \int_0^T io_i(t)dt, i=1,2, \ldots, M \quad (7)$$

Again, restricting the waveforms of $vo_i(t)$ to periodical pulse functions with fixed pulse width of $T_p$, the invention maps the accumulated total current to a unique frequency value of the $vo_i(t)$ pulse waveform such that:

$$\beta \cdot \int_T^{2T} vo_i(t)dt = I_i^{total}, i=1,2, \ldots, M \quad (8)$$

where $\beta$ is a positive constant scalar number.

After obtaining the $vo_i(t)$ waveforms, the mapping function $M_B$ is implemented by mapping the frequency value of $vo_i(t)$ to the real number bi such that:

$$b_i = \gamma \cdot \int_0^T vo_i(t)dt, i=1,2, \ldots, M \quad (9)$$

where $\gamma$ is a constant scalar number.

If Equations 2, 6, 7, 8 and 9 are combined, the complete process performed by the present invention from inputs $a_j$ (j=1, 2, . . . , N) to outputs $b_i$ (i=1, 2, . . . , M) can be captured as:

$$\begin{aligned} b_i &= \gamma \cdot \int_0^T vo_i(t)dt \\ &= \frac{\gamma}{\beta} \cdot I_i^{total} \\ &= \frac{\gamma}{\beta} \cdot \int_0^T io_i(t)dt \\ &= \frac{\gamma}{\beta} \cdot \sum_{j=1}^{N}\left(g_{i,j} \cdot \int_0^T vi_j(t)dt\right) \\ &= \frac{\gamma}{\alpha \cdot \beta} \cdot \sum_{j=1}^{N}(g_{i,j} \cdot a_j), i=1, 2, \ldots, M \end{aligned} \quad (10)$$

What is claimed is:

1. A resistive memory array signal processor, comprising:
   a first converter for converting a real number vector input into a temporal sequence of voltage waveform outputs;
   at least one resistive memory array, having said sequence of voltage waveforms as inputs, for converting said sequence of voltage waveforms into current waveform outputs;
   an integrator for accumulating said current waveform outputs;
   a second converter, having said accumulated current waveforms as inputs, for converting said accumulated current waveforms into voltage waveform outputs; and
   a third converter, having said voltage waveforms as inputs, for converting said voltage waveforms into a real number output.

2. The apparatus of claim 1, wherein said resistive memory array comprises:
   a plurality of word lines, each said word line having an input;
   a plurality of bit lines, each said bit line having an output; and a plurality of resistive memory devices, each of said resistive memory device having a first terminal and a second terminal;
wherein each of said plurality of word lines intersects each of said plurality of bit lines; and
wherein a resistive memory device is connected at each said intersection, said first terminal of said resistive memory device is connected to said intersected word line and said second terminal of said resistive memory device is connected to said intersected bit line.

3. The apparatus of claim 1, wherein said temporal sequence of voltage waveform outputs comprises a pulse-based voltage waveform.

4. The apparatus of claim 3, wherein said first converter performs the following process:

$$a_j=\alpha\int_0^T vi_j(t)dt, j=1,2,\ldots,N$$

where
$vi_j(t)$ is said pulse-based voltage waveform applied at each said wordline;
$a_j$ is said real number input;
$\alpha$ is a positive constant scalar number;
N is a positive integer number; and
T is the pulse width of said pulse-based voltage waveform.

5. The apparatus of claim 2, wherein each of said resistive memory devices has a conductance $g_{ij}$, where i and j are real integer numbers corresponding to the location of said resistive memory device in said array.

6. The apparatus of claim 5, wherein said integrator accumulates said current waveform outputs according to:

$$\int_0^T io_i(t)dt = \sum_{j=i}^N \left( g_{i,j} \cdot \int_0^T vi_j(t)dt \right), i = 1, 2, \ldots, M$$

where
$io_i$ is current waveform output from each said bitline; and
M is a positive integer number.

7. The apparatus of claim 6, wherein said second converter converts said accumulated current waveforms according to:

$$\beta \cdot \int_T^{2T} vo_i(t)dt = I_i^{total}, i=1,2,\ldots,M$$

where
$\beta$ is a constant scalar number;
$I_i^{total}$ is said accumulated current from said current waveforms; and
$vo_i(t)$ is said output voltage waveforms.

8. The apparatus of claim 7, wherein said third converter converts said output voltage waveforms into said real number outputs according to:

$$b_i=\gamma \cdot \int_0^T vo_i(t)dt, i=1,2,\ldots,M$$

where
$\gamma$ is a constant scalar number; and
$b_i$ is a real number.

9. A method for performing resistive memory based signal processing, comprising the steps of:
a first step of converting a real number vector input into a temporal sequence of voltage waveform outputs;
applying said sequence of voltage waveforms as multiple inputs to at least one array of said resistive memory devices, so as to convert said sequence of voltage waveforms into multiple current waveform outputs;
accumulating each of said multiple current waveform outputs;
integrating across all of said multiple current waveform outputs;
a second step of converting said integrated current waveforms into voltage waveforms; and
a third step of converting said voltage waveforms into real number outputs.

10. The method of claim 9, wherein said temporal sequence of voltage waveform outputs comprises a pulse-based voltage waveform.

11. The method of claim 10, wherein said first step of converting performs the following process:

$$a_j=\alpha\int_0^T vi_j(t)dt, j=1,2,\ldots,N$$

where
$vi_j(t)$ is said pulse-based voltage waveform applied at each array input;
$a_j$ is said real number;
$\alpha$ is a positive constant scalar number;
N is a positive integer number; and
T is the pulse width of said pulse-based voltage waveform.

12. The method of claim 9, wherein each of said resistive memory devices has a conductance $g_{ij}$, where i and j are real integer numbers corresponding to the location of said resistive memory device in said array.

13. The method of claim 12, wherein said step of integration further comprises the step of integrating said current waveform outputs according to:

$$\int_0^T io_i(t)dt = \sum_{j=i}^N \left( g_{i,j} \cdot \int_0^T vi_j(t)dt \right), i = 1, 2, \ldots, M$$

where
$io_i$ is current waveform output from each array output; and
M is a positive integer number.

14. The method of claim 6, wherein said second conversion converts said accumulated current waveforms according to:

$$\beta \cdot \int_T^{2T} vo_i(t)dt = I_i^{total}, i=1,2,\ldots,M$$

where
$\beta$ is a constant scalar number;
$I_i^{total}$ is said accumulated current from said current waveforms; and
$vo_i(t)$ is said output voltage waveforms.

15. The method of claim 7, wherein said third conversion converts said output voltage waveforms into said real numbers according to:

$$b_i=\gamma \cdot \int_0^T vo_i(t)dt, i=1,2,\ldots,M$$

where
$\gamma$ is a constant scalar number; and
$b_i$ is a real number.

16. A method for performing signal processing using a crossbar array of resistive memory devices, comprising the steps of:
a first mapping of a real number input to a voltage waveform;
applying said voltage waveform to a plurality of wordline inputs of said crossbar array of resistive memory devices;
accumulating current waveforms through each of a plurality of bitline outputs of said crossbar array of resistive memory devices;

integrating said accumulated current waveforms;
converting said integrated current waveforms to voltage waveforms; and
a second mapping of said voltage waveforms to a real number output.

17. The method of claim 16, wherein said second mapping is the reverse operation of said first mapping.

18. The method of claim 17, wherein said first mapping a said second mapping apply scaling factors unique to each.

19. The apparatus of claim 2, wherein said resistive memory device comprises one of the following configurations:
   a single memristor;
   a plurality of memristors in series; and
   a memristor connected in series with the drain and source of a transistor.

20. The apparatus of claim 8, wherein said real number outputs are represented as a function of said real number inputs and said resistive memory device conductance according to:

$$b_i = \frac{\gamma}{\alpha \cdot \beta} \cdot \sum_{j=1}^{N} (g_{i,j} \cdot a_j), i = 1, 2, \ldots, M.$$

* * * * *